(12) United States Patent
Poenaru et al.

(10) Patent No.: US 7,245,536 B1
(45) Date of Patent: Jul. 17, 2007

(54) PRECISION NON-VOLATILE CMOS REFERENCE CIRCUIT

(75) Inventors: Ilie Marian I. Poenaru, Bucharest (RO); Sabin A. Eftimie, Victoria (RO); Sorin S. Georgescu, San Jose, CA (US)

(73) Assignee: Catalyst Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 11/355,394

(22) Filed: Feb. 15, 2006

(51) Int. Cl.
*G11C 16/06* (2006.01)

(52) U.S. Cl. .............................. 365/185.2; 365/189.09; 365/226

(58) Field of Classification Search ............. 365/185.2, 365/189.09, 189.11, 226, 228, 210; 327/535–537
See application file for complete search history.

(56) References Cited

U.S. PATENT DOCUMENTS

| | | | | |
|---|---|---|---|---|
| 4,977,527 A | * | 12/1990 | Shaw et al. | .................... 702/85 |
| 6,147,908 A | * | 11/2000 | Abugharbieh et al. | ... 365/185.2 |
| 6,184,726 B1 | * | 2/2001 | Haeberli et al. | ............... 327/96 |
| 6,301,156 B1 | * | 10/2001 | Kurosaki | ................. 365/185.2 |
| 2006/0145747 A1 | * | 7/2006 | Ucciardello et al. | ........ 327/536 |

* cited by examiner

*Primary Examiner*—Gene N. Auduong
(74) *Attorney, Agent, or Firm*—Bever, Hoffman & Harms, LLP; E. Eric Hoffman

(57) ABSTRACT

A voltage reference circuit provides a reference voltage that can be precisely programmed. The threshold voltage of a first non-volatile memory (NVM) transistor is programmed while coupled in parallel with a reference NVM transistor. During programming, the reference NVM transistor has a floating gate coupled to ground through a first set of capacitors, and coupled to a reference voltage through a second set of capacitors. The program threshold voltage of the first NVM transistor is dependent on the first and second sets of capacitors. The first and reference NVM transistors are then coupled in parallel, and a differential amplifier is used to generate a single-ended reference voltage in response to the programmed threshold voltage of the first NVM transistor. Capacitors can be transferred between the first set and the second set, thereby providing precise adjustment of the single ended reference voltage.

24 Claims, 4 Drawing Sheets

PRECISION NON-VOLATILE CMOS REFERENCE CIRCUIT

BACKGROUND OF THE INVENTION

1. Technical Field

The present invention is in the field of non-volatile programmable integrated circuits.

2. Description of Related Art

Voltage references are built in two main types: (1) band-gap based reference circuits; and (2) non-volatile memory cell-based reference circuits.

The vast majority of voltage references used today essentially replicate the silicon band-gap voltage and involve significant amount of circuitry to allow for proper functionality. A typical band-gap circuit includes a number of bipolar transistors (NPN or PNP) and an associated set of resistors. The forward voltage of a P-N diode has a large temperature coefficient, which is canceled by adding a series resistive voltage drop having opposite temperature coefficient. There are significant drawbacks with this classical approach, including: (1) the reference tuning is difficult and requires lengthy silicon iterations, (2) the operation at low currents requires very large resistors, and (3) the overall circuit is rather complicated and expensive in terms of silicon area. Moreover, the classical band-gap circuits have difficulty achieving a very low temperature coefficient due to inherent second order temperature effects. Trimming the reference to values other than the silicon band-gap requires additional circuits and involves a significant increase in area consumption.

Voltage references based on non-volatile memory cells are a more recent approach in integrated circuits. In general, a floating node of a non-volatile memory cell is programmed to a desired voltage level. The programmed voltage level is then copied to a low impedance node using standard analog circuit methods. It is noted that any floating node capacitor can keep a certain amount of charge (and voltage) indefinitely, due to extremely low leakage of silicon oxides. For the same reason, such floating nodes cannot be used as direct reference voltages, since they cannot drive any current. An amplifier is needed to buffer the floating node onto a low impedance reference node, which can be used for external purposes. In this regard, the reader is directed to the following references, which are incorporated herein by reference in their respective entireties: U.S. Pat. No. 6,297,689 (Merrill); and U.S. Pat. No. 6,414,536 (Chao).

The use of a single floating node of a non-volatile memory cell to generate a voltage reference has a number of drawbacks, including: (1) the circuit required to program the single floating node introduces a capacitive coupling, which produces an offset between the programmed voltage and the read voltage, (2) charge de-trapping occurring after the programming step introduces another uncertainty in the final programmed reference voltage, (3) programming stress can unpredictably change the characteristics of the non-volatile memory cell, such that resistor trimming is necessary, and (4) to obtain the lowest temperature coefficient, measurements at different ambient temperatures are required. All these impose serious restrictions in the manufacturing process for voltage references using a single floating node of a non-volatile memory cell.

A more advanced type of non-volatile reference uses two floating gate transistors in a differential mode. The floating gates of the transistors are programmed through hot electron injection using Flash-type transistors. In the read mode, a feedback amplifier produces a differential reference voltage between two nodes, wherein the differential reference voltage is the result of different thresholds of the floating gate transistors and of a bias current injected into one of the two nodes. There are number of drawbacks associated with this type of non-volatile reference. The use of hot electrons injection for charge injection makes the precise programming very difficult, because hot electron injection is very fast and non-linear with time. As a result, the precise programming of a reference voltage is a difficult task. In addition, the reference voltage is programmed in an open loop, thus requiring many iterations to obtain the target reference voltage. Such concerns are amplified in a production environment, where a precise target reference voltage has to be programmed in a simple test flow. Further complications arise from the fact that the differential reference voltage is obtained as voltage floating above the ground, so additional analog processing is needed to transfer the differential reference voltage to a single ended reference voltage. The additional circuitry not only adds to the cost of the solution but also introduces distortions that diminish the accuracy of the reference voltage.

It would therefore be desirable to have a voltage reference circuit that overcomes the above-described deficiencies of the prior art.

SUMMARY

Accordingly, the present invention provides a voltage reference circuit that includes a first non-volatile memory (NVM) transistor and a reference NVM transistor. The reference NVM transistor is initially set to a neutral state. For example, the reference NVM transistor may be exposed to ultra-violet radiation. The reference NVM transistor retains this neutral state throughout the operation of the voltage reference circuit. The first NVM transistor is then erased.

The voltage reference circuit is then configured to program the first NVM transistor, by coupling the first NVM transistor in a current mirror configuration with the reference NVM transistor. A first reference voltage, such as ground, is applied to the control gates of the first and reference NVM transistors. A first set of one or more capacitors is coupled between a base reference voltage supply ($V_{REF}$) and a floating gate of the reference NVM transistor, while a first set of one or more capacitors is coupled between the floating gate and control gate of the reference NVM transistor. The first and second sets of capacitors form a voltage divider circuit, which applies a program control voltage to the floating gate of the reference NVM transistor. The program control voltage is a percentage of the base reference voltage $V_{REF}$ determined by the ratio of the capacitances in the first and second sets of capacitors. A programming ramp voltage is applied to a programming terminal of the first NVM transistor, thereby programming the first NVM transistor through Fowler-Nordheim tunneling. Programming of the first NVM transistor is automatically stopped when the current through the first NVM transistor is at least as great at the current through the reference NVM transistor. As a result, the programmed threshold voltage of the first NVM transistor is referenced to the program control voltage on the floating gate of the reference NVM transistor.

The voltage reference circuit is then configured to perform a read operation, by coupling the first NVM transistor in a current mirror configuration with the reference NVM transistor. During the read operation, the control gates of the first and reference NVM transistors are coupled to receive the ground supply voltage, and the drains of the first and reference NVM transistors are coupled to input-terminals of a differential amplifier. The output terminal of the differential amplifier is coupled to the floating gate of the reference NVM transistor through the first set of capacitors (while the second set of capacitors remains connected between the floating gate and control gate of the reference NVM transistor). Under these conditions, the differential amplifier provides a single-ended output voltage that is precisely equal to the programmed threshold voltage of the first NVM transistor. In accordance with one embodiment of the present invention, the output voltage can be adjusted by shifting capacitors between the first and second sets of capacitors. In one embodiment, the capacitors available for shifting have a binary weighting, thereby enabling precise control of the output voltage.

In accordance with one embodiment, the first and reference NVM transistors are matched. In addition, the MOS transistors used to couple these NVM transistors in the various current mirror configurations are matched. Using matched MOS devices cancels the first order variations of the programmed reference voltage as compared to the desired value. By using the reference NVM transistor and associated MOS devices as a reference in the differential programming circuit, even second order voltage shifts are canceled, thus realizing a very precise and stable reference voltage. In one embodiment, the programming operations are automatically stopped with the floating gate voltages at the desired values by implementing a quasi-read function during the programming steps. Because the programming does not affect the mirror matching, the programmed reference has very good precision and very low intrinsic temperature coefficient.

The present invention will be more fully understood in view of the following description and drawings.

DETAILED DESCRIPTION

Figure 1:
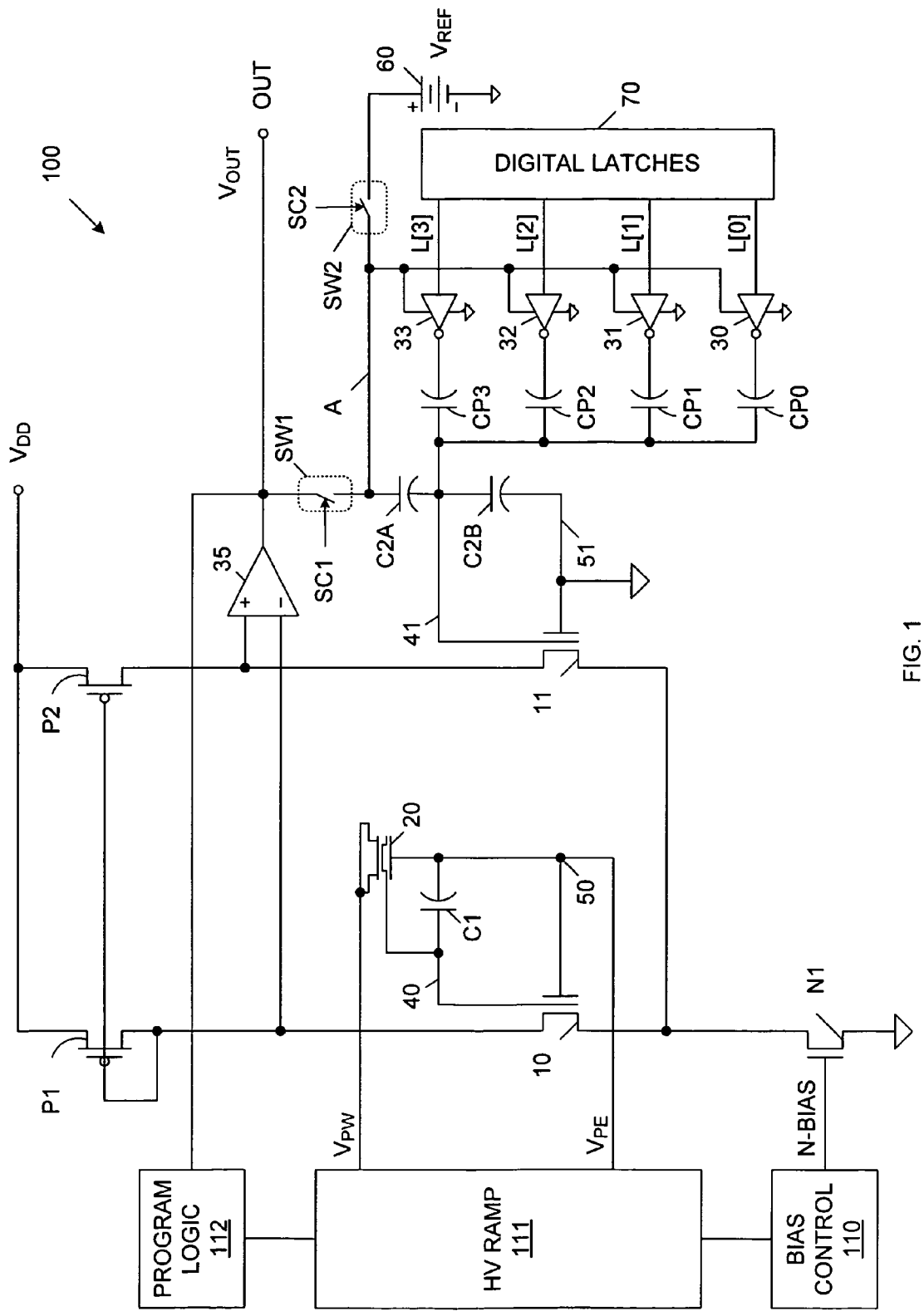
FIG. 1 is a circuit diagram of a voltage reference circuit in accordance with one embodiment of the present invention.

FIG. 1 is a circuit diagram of a CMOS voltage reference circuit 100 in accordance with one embodiment of the present invention. Voltage reference circuit 100 includes non-volatile memory (NVM) transistors 10–11, thin-dielectric tunnel capacitor 20, p-channel MOS transistors P1–P2, n-channel MOS transistor N1, capacitors C1, C2A, C2B, CP0, CP1, CP2 and CP3, inverter circuits 30–33, differential amplifier 35, switches SW1–SW2, reference voltage supply 60 and digital latches 70.

Non-volatile memory transistors 10–11 include floating gates 40–41, respectively, and control gates 50–51, respectively. Each of non-volatile memory transistors 10–11 has a standard double polysilicon gate structure with a dielectric thickness large enough (e.g., greater than 150 Angstroms) to prevent charge leakage from the floating gates 40–41. In one embodiment, each of the floating gates 40–41 is separated from the corresponding control gate 50–51 by a dielectric with effective silicon dioxide thickness of about 150–250 Angstroms. This dielectric can be, for example, a sandwich of silicon oxide/silicon nitride/silicon oxide (ONO). The control gate 50–51 of each memory transistor 10–11 is capacitively coupled to the respective floating gate 40–41 through this dielectric. In the described embodiment, non-volatile memory transistors 10–11 are identical.

Capacitor C1 is coupled between floating gate 40 and control gate 50 of non-volatile memory transistor 10. Similarly, capacitor C2B is coupled between floating gate 41 and control gate 51 of non-volatile memory transistor 11. Capacitors C2A and CP0–CP3 are also coupled to floating gate 41. Capacitors C1, C2A–C2B and CP0–CP3 increase the capacitive coupling to the floating gates 40–41. Capacitors C1, C2A–C2B and CP0–CP3 also help to lower the required programming voltage, and increase the lifetime of the programmed reference voltage by allowing some small discharge of the floating gates 40–41, especially at high temperatures.

Tunnel capacitor 20 is formed by a floating gate transistor having source and drain regions commonly coupled to a first programming voltage terminal VPW, a control gate coupled to control gate 50 and a floating gate coupled to floating gate 40. A second programming voltage terminal VPE is also coupled to control gate 50. The first and second programming voltage terminals VPW and VPE are driven by high-voltage ramp circuit 111.

In the described embodiment, tunnel capacitor 20 has a thin dielectric (about 60–120 Angstroms of effective silicon dioxide) that can conduct current under a high voltage bias, in the range of about 6 to 12 Volts. As described in more detail below, tunneling current is passed through the thin dielectric of tunnel capacitor 20 to floating gate 40, thus changing the threshold voltage of non-volatile memory transistor 10 to desired levels. More specifically, tunnel capacitor 20 allows the electrical charging of floating gate 40 through Fowler-Nordheim oxide conduction, by applying a large voltage (of either polarity) across the thin oxide of tunnel capacitor 20. This physical process is well known to those knowledgeable in the field of EEPROM memory devices.

The sources of non-volatile memory transistors 10–11 are commonly connected to the drain of n-channel transistor N1. The source of n-channel transistor N1 is coupled to ground, and the gate of n-channel transistor N1 is coupled to receive a bias signal, N-BIAS, from bias control circuit 110. The drains of non-volatile memory transistors 10 and 11 are coupled to the drains of p-channel transistors P1 and P2, respectively. The sources of p-channel transistors P1 and P2 are commonly connected to the $V_{DD}$ voltage supply terminal. The gates of p-channel transistors P1 and P2 are commonly connected to the drain of p-channel transistor P1. P-channel transistors P1 and P2 are therefore arranged in a current mirror configuration. In the described embodiment, p-channel transistors P1 and P2 are identical transistors. As a result, p-channel transistors P1–P2 and non-volatile memory transistors 10–11 form two matched circuit branches.

The input terminals of differential amplifier 35 are coupled to the drains of p-channel transistors P1 and P2. The output terminal of differential amplifier 35 is coupled to program logic 112 and reference voltage output terminal OUT. Switch SW1 is coupled between the reference voltage output terminal and node A. Node A, in turn, is coupled to a first terminal of capacitor C2A and to the positive supply terminals of inverters 30–33. Switch SW2 is coupled between node A and reference voltage source 60.

Reference voltage source 60 provides a fixed reference voltage $V_{REF}$ to switch SW2. As will become clear in view of the following description, the fixed reference voltage is selected to correspond with a desired output reference voltage OUT in the described embodiment. Each of the switches SW1–SW2 is controlled by a corresponding switch control signal SC1–SC2. Each of the switch control signals SC1–SC2 is either activated, thereby closing (or turning on) the associated switch (i.e., placing the associated switch in a conductive state), or de-activated, thereby opening (or turning off) the associated switch (i.e., placing the associated switch in a non-conductive state). Each of switches SW1–SW2 is shown in an open state in FIG. 1 for purposes of illustration. In the described embodiment, switches SW1–SW2 are low-voltage CMOS switches, each having an identical construction.

A second terminal of capacitor C2A is coupled to floating gate 41. Similarly, each of capacitors CP0, CP1, C2 and CP3 has a terminal coupled to floating gate 41. The other terminals of capacitors CP0, CP1, CP2 and CP3 are coupled to output terminals of inverters 30, 31, 32 and 33, respectively. The input terminals of inverters 30, 31, 32, and 33 are coupled to receive the latched control signals L[0], L[1], L[2] and L[3], respectively, from digital latch circuit 70. The output terminals of inverters 30–33 are coupled to node A or the ground supply voltage in response to the latched control signals L[0:3]. Initially, each of the latched control signals L[0:3] has a logic "0" state, such that each of the inverters 30–33 provides an output voltage equal to the voltage on node A.

It is preferable to have the same total capacitance on each of floating gates 40 and 41. In the described embodiment, the capacitance of capacitor C1 is equal to the sum of the capacitances of capacitors C2A, C2B and CP0–CP3. The equivalence of the two branches containing memory transistors 10 and 11 ensures a very low temperature coefficient of the output reference voltage. As described in more detail below, the connection of capacitors CP0–CP3 can be modified, thereby resulting in precise digital adjustments of the output reference voltage. However, modifying the connection of capacitors CP0–CP3 does not change the total capacitance on floating gate 41, thereby preserving the very low temperature coefficient.

In general, voltage reference circuit 100 operates as follows.

Non-volatile memory transistor 11 is initially controlled to have a reference threshold voltage. In one embodiment, floating gate 41 of non-volatile memory transistor 11 is initially discharged to a neutral state by ultra-violet (UV) irradiation (e.g., using a UV erase procedure of a standard EEPROM memory process). Note that the floating gate 40 of transistor 10 is typically discharged at the same time as floating gate 41. However, after the initial discharge is complete, the threshold voltage of non-volatile memory transistor 11 remains the same throughout the operation of reference voltage circuit 100. That is, there is no intentional charge transfer in or out of the floating gate 41 after the reference threshold voltage has been set in non-volatile memory transistor 11. As described in more detail below, the reference threshold voltage set in non-volatile memory transistor 11 is used as a reference during subsequent programming of non-volatile memory transistor 10. For this reason, non-volatile memory transistor 11 may be referred to as a reference memory transistor herein.

After the first threshold voltage has been set within reference memory transistor 11, an erase operation is performed on non-volatile memory transistor 10. The erase step is used to set an initial large negative charge (which corresponds to a high threshold voltage) on floating gate 40 of non-volatile memory transistor 10.

Non-volatile memory transistor 10 is then programmed. More specifically, the floating gate 40 of non-volatile memory transistor 10 is programmed with a precise positive charge, in a closed loop cycle, using the threshold voltage of reference memory transistor 11 as a reference state. For example, non-volatile memory transistor 10 is programmed while coupled in parallel with reference memory transistor 11. During this programming step, the control gates 50 and 51 of NVM transistors 10 and 11 are both coupled to ground. The floating gate 41 of NVM transistor 11 is held at a predetermined voltage which is a percentage of the reference voltage $V_{REF}$, as determined by the configuration of capacitors C2A, C2B and CP0–CP3. As a result, NVM transistor 10 is programmed to have a first threshold voltage, which is associated with the reference voltage $V_{REF}$.

A read operation is then enabled, wherein NVM transistors 10 and 11 are coupled to differential amplifier 35, thereby causing differential amplifier 35 to output a reference voltage which corresponds with the programmed threshold voltage of NVM transistor 10. The output reference voltage can be precisely adjusted by reconfiguring the effective connections of capacitors CP0–CP3 (i.e., by modifying the latched control signals L[0:3]). In this manner, a stable and precise reference voltage is provided on a low impedance node.

As described in more detail below, voltage reference circuit 100 implements the erase, program and read operations by controlling the states of CMOS switches SW1–SW2 and controlling the applied voltages VPW, VPE and L0–L3.

The present invention substantially increases the precision of the programmed reference voltage, increases the stability of the programmed reference voltage over time, reduces the current consumption required to implement a reference voltage circuit, and preserves a small overall circuit area.

The operation of reference voltage circuit 100 will now be described in more detail. Voltage reference circuit 100 includes n-channel transistor N1, which forms a current source. The current through n-channel transistor N1 is set by the N-BIAS signal applied to the gates of this transistor N1. In one embodiment, the N-BIAS control signal is generated by selecting a tap point along a string of diodes connected between the $V_{DD}$ voltage supply terminal and ground.

Erase Operation

Figure 2:
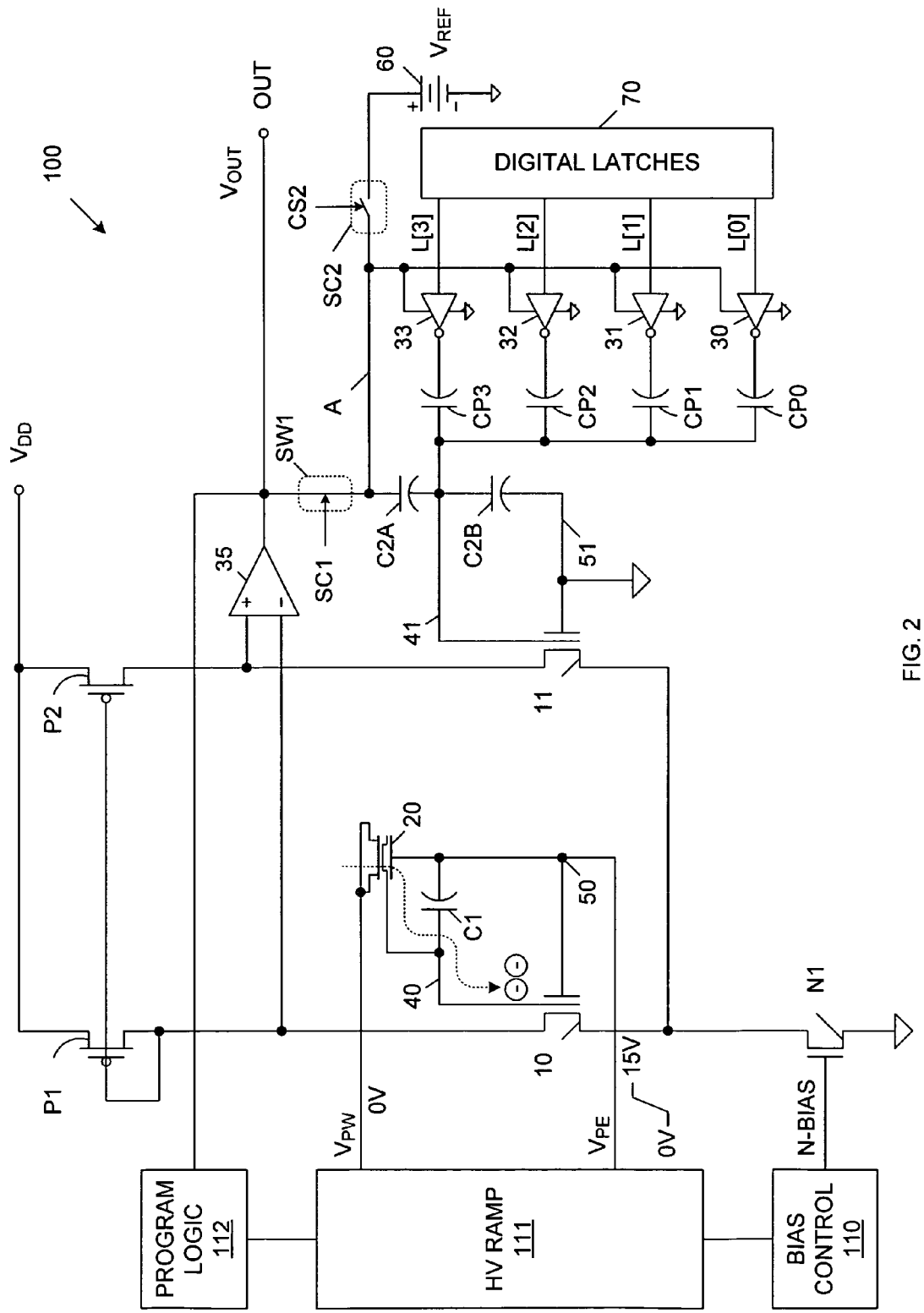
FIG. 2 is a circuit diagram of the voltage reference circuit of FIG. 1, configured to implement an erase operation.

FIG. 2 is a circuit diagram of voltage reference circuit 100, configured to implement an erase operation of non-volatile memory transistor 10. (This operation is referred to as an erase operation because of the similarities to an erase operation in an EEPROM memory.) At this time, the floating gate 41 of reference memory transistor 11 has already been discharged to a neutral state by UV exposure.

As illustrated in FIG. 2, switch SW1 is closed, thereby coupling the output of differential amplifier 35 to node A. Switch SW2 is open, such that reference voltage source 60 is decoupled from the rest of voltage reference circuit 100. Latched control signals L[0:3] each have a logic "0" state, such that capacitors CP0–CP3 are all coupled in parallel between node A and floating gate 41. High-voltage ramp circuit 111 provides a voltage of 0 Volts to the programming terminal VPW. High-voltage ramp circuit 111 also provides a voltage ramp signal to the programming terminal VPE. This voltage ramp signal varies from a low voltage of 0 Volts to a high voltage of 15 Volts. During this operation, the voltage applied across the thin dielectric of tunnel capacitor 20 results in a Fowler-Nordheim tunneling current that charges floating gate 40 with negative charge.

As a result, the threshold voltage of non-volatile memory transistor 10 is increased to a relatively large value, typically in the range of 2 to 8 Volts. The final potential of floating gate 40 and the corresponding threshold voltage of non-volatile memory transistor 10 is dependent on the highest value of the erase voltage pulse, VPE. The precise threshold voltage of non-volatile memory transistor 10 is not critical in this step, as this threshold voltage only sets an acceptable initial state before this non-volatile memory transistor 10 is subsequently programmed.

Program Operation

Figure 3:
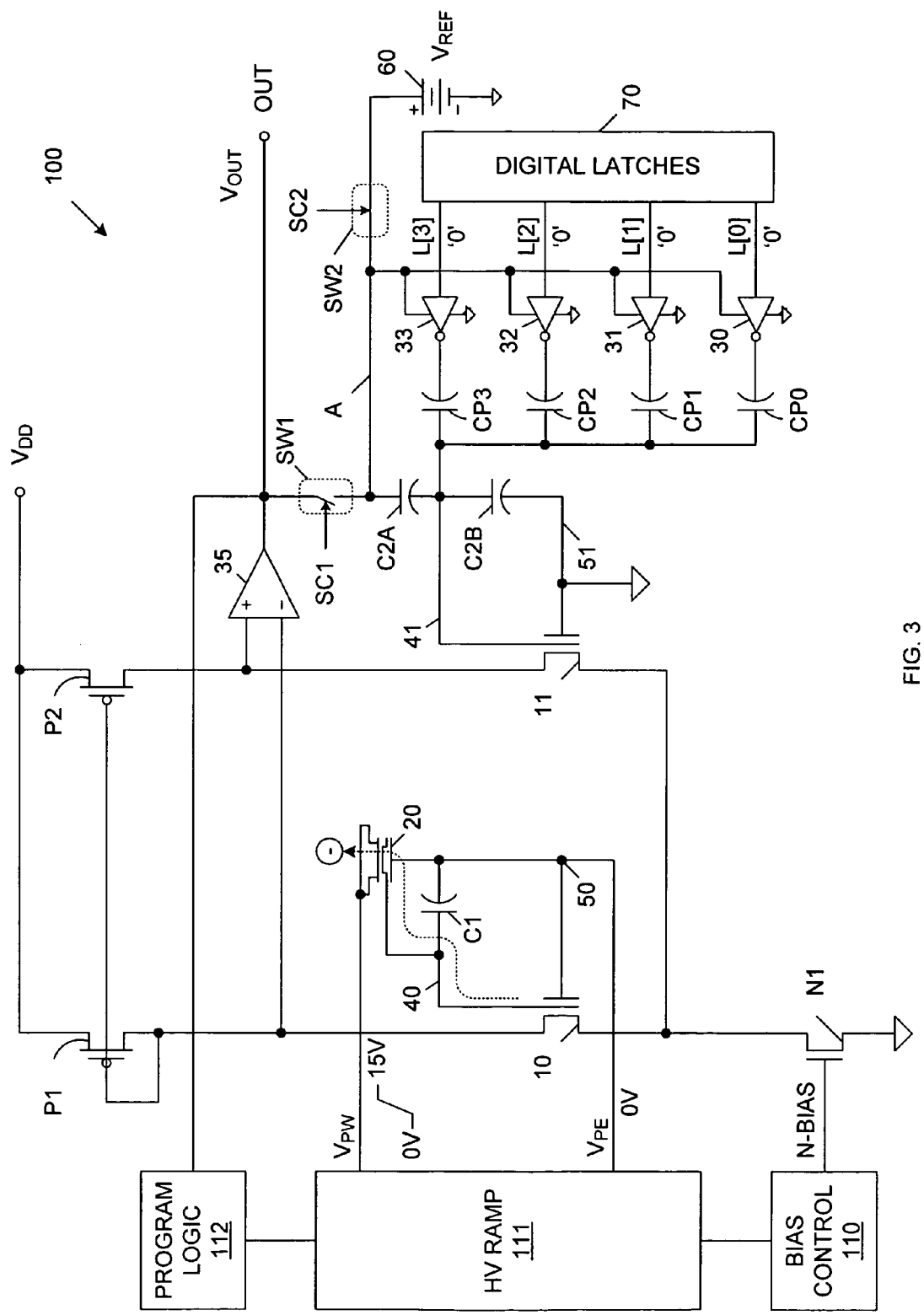
FIG. 3 is a circuit diagram of the voltage reference circuit of FIG. 1, configured to program the threshold voltage of a first non-volatile memory transistor, in a differential combination with a reference transistor.

FIG. 3 is a circuit diagram of reference voltage circuit 100, configured to program the threshold voltage of non-volatile memory transistor 10, in a differential combination with reference transistor 11. (This operation is referred to as a program operation because of the similarities to a program operation in an EEPROM memory.) At this time, non-volatile memory transistor 10 has already been erased as described above in connection with FIG. 2.

As illustrated in FIG. 3, switch SW2 is closed, thereby coupling reference voltage source 60 (and $V_{REF}$) to node A. Switch SW1 is open, thereby isolating node A from the output of differential amplifier 35. Latched control signals L[0:3] all have logic "0" values. As a result, inverters 30–33 apply the reference voltage $V_{REF}$ to the corresponding capacitors CP0–CP3. As a result, capacitors CP0–CP3 are effectively placed in parallel with capacitor C2A between floating gate 41 and the voltage reference source 60. The total capacitance ($C_{TOTA}$) between the voltage reference source 60 and the floating gate 41 of NVM transistor 11 can therefore be represented as follows.

$$C_{TOTA} = C2A + CP0 + CP1 + CP2 + CP3$$

The total capacitance between the floating gate 41 of NVM transistor 11 and ground ($C_{TOTB}$) is equal to the capacitance of capacitor C2B. The voltage ($V_{FG41}$) applied to floating gate 41 can therefore be represented as follows.

$$V_{FG41} = V_{REF} * [C_{TOTA}/(C_{TOTA} + C_{TOTB})]$$

High-voltage ramp circuit 111 then applies a high voltage ramp signal to programming terminal VPW, and applies a voltage of 0 Volts to programming terminal VPE. In the described embodiment, the programming voltage on terminal VPW is ramped up to a positive value greater than 10 Volts. Because control gate 50 (VPE) is grounded, the voltage applied across the thin dielectric of tunnel capacitor 20 results in Fowler-Nordheim tunneling current that removes negative charge from floating gate 40. As a result, the threshold voltage of non-volatile memory transistor 10 is reduced. Note that the high voltage applied across tunnel capacitor 20 has different polarities during the erase operation (FIG. 2) and the program operation (FIG. 3).

As more negative charge is removed from floating gate 40, the threshold voltage of transistor 10 continues to be reduced, thereby resulting in increased current flow through non-volatile memory transistor 10. The programming of non-volatile memory transistor 10 continues until the drain current through NVM transistor 10 is equal to the drain current through reference memory transistor 11. When the drain current of NVM transistor 10 becomes greater than the drain current through reference memory transistor 11, the output of differential amplifier 35 changes state, thereby causing program logic 112 to stop the programming operation (by instructing high voltage ramp circuit 111 to turn off the high voltage ramp applied to programming terminal VPW). At this time, the threshold voltage of non-volatile memory transistor 10 is programmed to a value which precisely represents the voltage $V_{FG41}$ provided on the floating gate 41 during programming. It is important to note that the threshold voltage of NVM transistor 10 is set while the floating gate 41 of reference memory transistor 11 is held at the voltage $V_{FG41}$. It is also important to note that the threshold voltage of NVM transistor 10 is set to a voltage which precisely represents a known ratio of the input reference voltage, $V_{REF}$.

Read Operation

Figure 4:
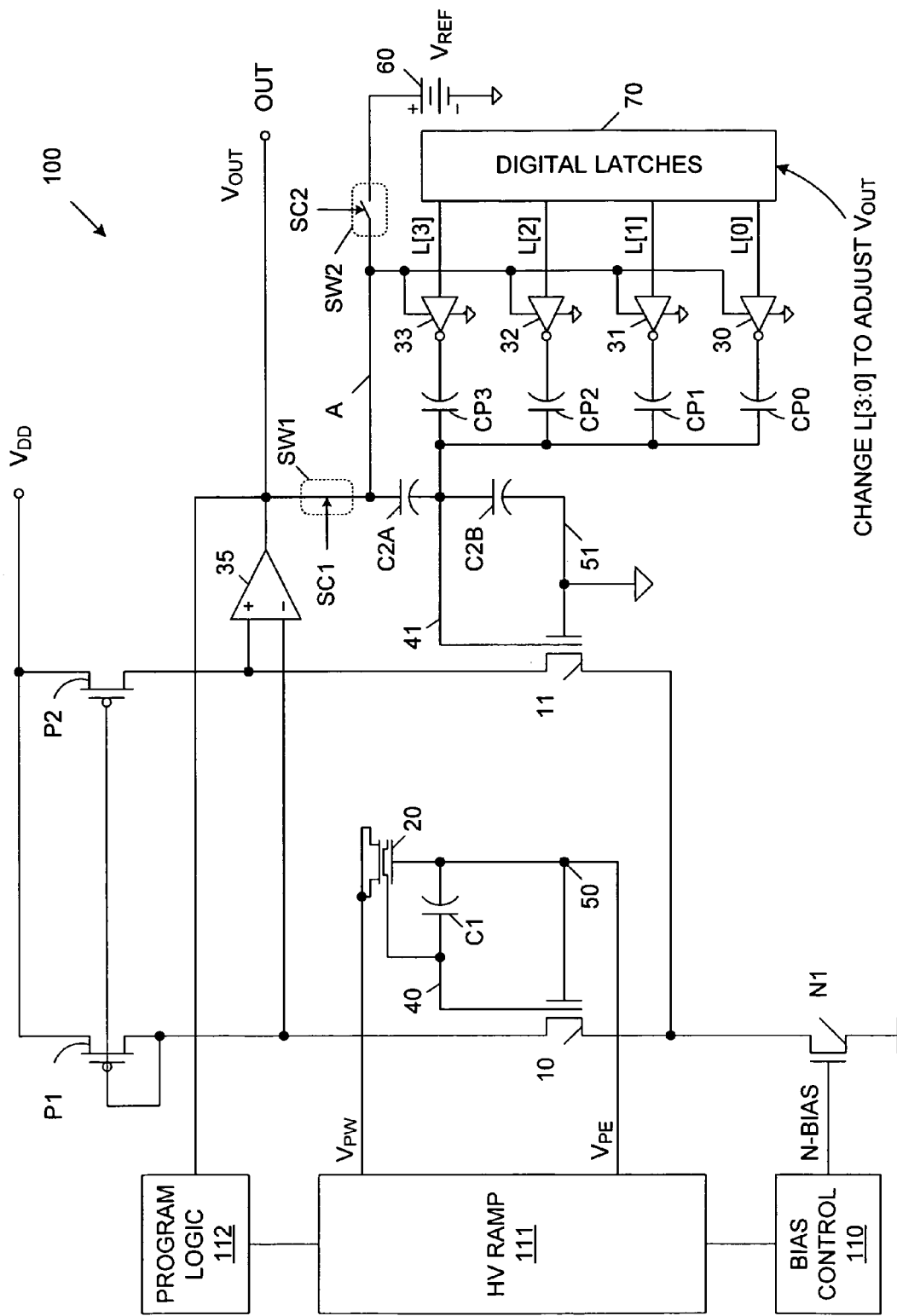
FIG. 4 is a circuit diagram of the voltage reference circuit of FIG. 1, configured to read the difference between the programmed threshold voltage of the transistor programmed in FIG. 3, and the threshold voltage of the reference transistor, thereby providing a single ended output reference voltage.

FIG. 4 is a circuit diagram of reference voltage circuit 100, configured to read the difference in the programmed threshold voltage of transistor 10 and the neutral threshold voltage of transistor 11, and in response, provide a single ended output reference voltage $V_{OUT}$. (This operation is referred to as a read operation because of the similarities to a read operation in an EEPROM memory.) At this time, non-volatile memory transistor 10 has already been programmed as described above in connection with FIG. 3.

As illustrated in FIG. 4, switches SW1 is closed, thereby coupling the output terminal of differential amplifier 35 to node A. Switch SW2 is open, thereby decoupling the reference voltage supply 60 from node A. When reference voltage circuit 100 has been configured in the above-described manner, high-voltage ramp circuit 111 applies a voltage of 0 Volts to programming terminal VPE (i.e., the control gate 50 of non-volatile memory transistor 10). High-voltage ramp circuit 111 also applies a voltage close to the programmed voltage of floating gate 40 (e.g., about 1 Volt) to programming terminal VPW (i.e., the source/drain terminal of tunnel capacitor 20). As a result, the voltage across the thin oxide of tunnel capacitor 20 is close to zero and the oxide leakage is practically eliminated.

Under these conditions, p-channel transistors P1 and P2 force identical currents to flow through the drains of NVM transistors 10 and 11, respectively. Any imbalance between the drain currents of NVM transistors 10 and 11 is amplified by differential amplifier 35. The output of differential amplifier 35 is fed back to the floating gate 41 of NVM transistor 11, thereby ensuring that the currents through NVM transistors 10 and 11 are equal and that the two floating gates 40 and 41 are maintained at the same voltage.

As a result, the output reference voltage $V_{OUT}$ is exactly equal to the programmed floating gate voltage 40 multiplied by the capacitance ratio $(C_{TOTA} + C_{TOTB})/C_{TOTA}$ of the capacitors coupled to floating gate 41. The capacitance ratio can be adjusted by modifying the latched control signals L[0:3]. Adjusting the capacitance ratio will adjust the output reference voltage $V_{OUT}$. Adjusting the output reference voltage $V_{OUT}$ by adjusting the capacitance ratio on floating gate 41 requires no current and has a very low temperature coefficient.

In one embodiment, the values of capacitors CP0–CP3 are chosen in ratios of powers of two, for a large range of coverage with minimal circuitry. For example, by using four capacitors CP0–CP3, with values corresponding to four bits (i.e., 1, 2, 4, 8), a total range of minimum to maximum voltage change of $(2^4-1)\times$ (i.e., 15×) is achieved, and the resolution of the output reference voltage $V_{OUT}$ is enhanced accordingly. Using ten capacitors in a similar manner will result in a total range of $(2^{10}-1)\times$ (i.e., ~1000×).

In general, capacitors C2A and C2B are used to set the ratio of the output voltage to the floating gate voltage, while capacitors CP0–CP3 are used for fine tuning the output reference voltage. For example, capacitor C1 may have a value of 100 capacitance units (e.g., nF), and capacitors C2A and C2B may each have a value of 42.5 capacitance units, capacitors CP0, CP1, CP2 and CP3 may have values of 1, 2, 4 and 8 capacitance units, respectively.

During the programming step, the voltage on floating gate 41 $V_{FG41}$ is equal to $V_{REF} \times (42.5+15)/(85+15)$, or 0.575 $V_{REF}$. Thus, during the read operation, the reference output voltage $V_{OUT}$ will be equal to 0.575 $V_{REF}$ as long as all of the latched control signals L[0:3] remain in a logic '0' state. However, if any of the latched control signals are modified to have a logic '1' value, then the reference output voltage $V_{OUT}$ will be adjusted to a lower voltage. This occurs because each latched control signal that is modified to have a logic '1' value will remove the corresponding capacitor from a parallel connection with capacitor C2A, and place this corresponding capacitor in a parallel connection with capacitor C2B. Table 1 below illustrates the various output reference voltages generated in response to the latched control signals L[3:0].

TABLE 1

| L [3:0] | $V_{OUT}$ | $V_{OUT}$ if $V_{REF}$ = 5 V |
|---------|-----------|------------------------------|
| 0000 | 0.575 $V_{REF}$ | 2.875 V |
| 0001 | 0.565 $V_{REF}$ | 2.825 V |
| 0010 | 0.555 $V_{REF}$ | 2.775 V |
| 0011 | 0.545 $V_{REF}$ | 2.725 V |
| 0100 | 0.535 $V_{REF}$ | 2.675 V |
| 0101 | 0.525 $V_{REF}$ | 2.625 V |
| 0110 | 0.515 $V_{REF}$ | 2.575 V |
| 0111 | 0.505 $V_{REF}$ | 2.525 V |
| 1000 | 0.495 $V_{REF}$ | 2.475 V |
| 1001 | 0.485 $V_{REF}$ | 2.425 V |
| 1010 | 0.475 $V_{REF}$ | 2.375 V |
| 1011 | 0.465 $V_{REF}$ | 2.325 V |
| 1100 | 0.455 $V_{REF}$ | 2.275 V |
| 1101 | 0.445 $V_{REF}$ | 2.225 V |
| 1110 | 0.435 $V_{REF}$ | 2.175 V |
| 1111 | 0.425 $V_{REF}$ | 2.125 V |

In accordance with one embodiment, reference voltage source 60 is selected to provide a reference voltage $V_{REF}$, that results in an output reference voltage $V_{OUT}$ that is greater than the desired output reference voltage $V_{OUT}$ when all of the latched control signals L[3:0] have a logic '0' value. For example, in accordance with Table 1, when the reference voltage $V_{REF}$ has a voltage of 5 Volts, the desired output reference voltage $V_{OUT}$ may be 2.525 Volts, such that expected operating value of L[3:0] would be '0111', with adjustments available above and below this operating value.

Alternately, the programming operation may be performed with the latched control signals L[3:0] having a value of '0111'. This would allow the use of a lower reference voltage $V_{REF}$, while maintaining the ability to adjust the output reference voltage $V_{OUT}$ both up and down.

The erase and program operations can be repeated as many times as needed. The reference cycling endurance is related to the endurance of the EEPROM memory made with the same process. This allows the reference voltage to be reprogrammed at least 1000 times, without any detrimental effect.

The disclosed voltage reference circuit 100 may be implemented in any integrated circuit requiring a stable reference voltage. The programming may be done before singulation of the integrated circuit from a wafer, or afterwards, such as after assembly of the integrated circuit into a package.

The CMOS logic needed to actuate switches SW1–SW2, to apply the high voltage pulses on terminals VPW and VPE is straightforward and could be easily implemented by persons of ordinary skill in the art in various ways.

Although the invention has been described in connection with several embodiments, it is understood that this invention is not limited to the embodiments disclosed, but is capable of various modifications, which would be apparent to one of ordinary skill in the art. Accordingly, the present invention is only limited by the following claims.

We claim:

1. A method of providing a reference voltage in an integrated circuit, comprising:
   coupling a first set of one or more capacitors between a floating gate of a reference non-volatile memory (NVM) transistor and a reference voltage source;
   coupling a second set of one or more capacitors between the floating gate and a control gate of the reference NVM transistor;
   programming a threshold voltage of a first non-volatile memory (NVM) transistor while coupled in parallel with the reference NVM transistor; and
   generating a single-ended reference voltage in response to the programmed threshold voltage of the first NVM transistor.

2. The method of claim 1, further comprising transferring one or more capacitors between the first set and the second set, thereby adjusting the single-ended reference voltage.

3. The method of claim 2, wherein the step of transferring is performed in response to one or more values stored in one or more corresponding latches.

4. The method of claim 1, further comprising coupling each of the one or more capacitors in the first set in parallel.

5. The method of claim 1, further comprising coupling each of the one or more capacitors in the second set in parallel.

6. The method of claim 1, wherein the step of programming the threshold voltage of the first NVM transistor comprises:
   applying a first voltage to a control gate of the first NVM transistor and the control gate of the reference NVM transistor; and
   applying a programming voltage to a programming terminal of the first NVM transistor.

7. The method of claim 6, wherein the step of programming the threshold voltage of the first NVM transistor further comprises:
   removing the first programming voltage from the programming terminal of the first NVM transistor when a current through the first NVM transistor at least equals a current through the reference NVM transistor.

8. The method of claim 6, further comprising selecting the first voltage to be ground.

9. The method of claim 2, wherein the step of generating the single-ended reference voltage comprises:
   coupling the first and reference NVM transistors in parallel in a current mirror configuration;
   coupling the first and reference NVM transistors to inputs of a differential amplifier; and
   coupling an output of the differential amplifier to the first set of one or more capacitors, wherein the first set of one or more capacitors is decoupled from the reference voltage source during the step of generating the single-ended reference voltage.

10. The method of claim 9, wherein the single-ended reference voltage is provided at the output of the differential amplifier.

11. The method of claim 9, further comprising transferring one or more capacitors between the first set and the second set, thereby adjusting the single-ended reference voltage.

12. The method of claim 1, further comprising erasing the first NVM transistor prior to programming the threshold voltage of the first NVM transistor.

13. The method of claim 1, wherein the threshold voltage of the first NVM transistor is programmed by Fowler-Nordheim tunneling.

14. The method of claim 1, further comprising initializing the threshold voltage of the reference NVM transistor to a neutral state prior to programming the threshold voltage of the first NVM transistor.

15. The method of claim 14, wherein the step of initializing the threshold voltage of the reference NVM transistor comprises exposing the reference NVM transistor to ultraviolet (UV) radiation.

16. A voltage reference circuit comprising:
 a first non-volatile memory (NVM) transistor having a first control gate and a first floating gate;
 a first capacitor coupled between the first control gate and the first floating gate;
 a reference NVM transistor having a second control gate and a second floating gate;
 a first set of one or more capacitors coupled between the second floating gate and a control terminal;
 a second set of one or more capacitors coupled between the second control gate and the second floating gate; and
 a control circuit configured to transfer one or more capacitors between the first and second sets of one or more capacitors.

17. The voltage reference circuit of claim 16, wherein the first capacitor has a capacitance equal to the sum of the capacitances of the first and second sets of one or more capacitors.

18. The voltage reference circuit of claim 16, wherein the first set of one or more capacitors comprises a first reference capacitor which is always coupled between the second floating gate and the control terminal, and the second set of one or more capacitors comprises a second reference capacitor which is always coupled between the second control gate and the second floating gate.

19. The voltage reference circuit of claim 18, wherein the first set of one or more capacitors further comprises a plurality of adjustment capacitors, each having a first terminal coupled to the second floating gate and a second terminal coupled to an output terminal of a corresponding inverter.

20. The voltage reference circuit of claim 18, wherein each corresponding inverter has an input terminal coupled to receive a latched control signal, wherein each latched control signal determines whether the corresponding adjustment capacitor is included in the first or second set of one or more capacitors.

21. The voltage reference circuit of claim 18, wherein each corresponding inverter has a first power terminal coupled to the control terminal, and a second power terminal coupled to ground.

22. The voltage reference circuit of claim 19, wherein the adjustment capacitors have capacitances that exhibit a binary weighting.

23. The voltage reference circuit of claim 16, further comprising a differential amplifier having inputs coupled to the first and reference NVM transistors.

24. The voltage reference circuit of claim 16, wherein the first and reference NVM transistors are connected in a current mirror configuration.

* * * * *